(12) United States Patent
Verma et al.

(10) Patent No.: US 7,605,605 B2
(45) Date of Patent: Oct. 20, 2009

(54) PROGRAMMABLE LOGIC CELLS WITH LOCAL CONNECTIONS

(75) Inventors: Hare K. Verma, Cupertino, CA (US); Ravi Sunkavalli, Milpitas, CA (US); Sudip Nag, San Jose, CA (US); Conrad Kong, San Jose, CA (US); Bo Hu, Santa Clara, CA (US); Chandra Mulpuri, San Jose, CA (US); Ashok Vittal, Fremont, CA (US)

(73) Assignee: Cswitch Corporation, Santa Clara, CA (US)

( * ) Notice: Subject to any disclaimer, the term of this patent is extended or adjusted under 35 U.S.C. 154(b) by 0 days.

(21) Appl. No.: 11/044,386

(22) Filed: Jan. 27, 2005

(65) Prior Publication Data

US 2006/0164120 A1 Jul. 27, 2006

(51) Int. Cl.
*H03K 19/177* (2006.01)
(52) U.S. Cl. .......................................... 326/41; 326/47
(58) Field of Classification Search ............. 326/37–41, 326/47
See application file for complete search history.

(56) References Cited

U.S. PATENT DOCUMENTS 5,942,914 A * 8/1999 Reddy et al. .................. 326/41
6,590,417 B1 * 7/2003 Jones et al. .................... 326/39
2004/0212393 A1 * 10/2004 Abramovici et al. .......... 326/38
2006/0132176 A1 * 6/2006 Lewis .......................... 326/44

\* cited by examiner

*Primary Examiner*—James Cho
(74) *Attorney, Agent, or Firm*—Intellectual Equity; Peter Su (57) ABSTRACT

A programmable logic structure is disclosed employing input logic routing cell (ILRC) multiplexers and output logic routing cell (OLRC) multiplexers for making local connections between dedicated logic cells. In a simple programmable logic structure, a dedicated logic cell (DLC) is implemented in a programmable logic structure comprising multiple ILRC multiplexers for port A and multiple OLRC multiplexers for port B. In a multi-level programmable logic structure, multiple columns of dedicated logic cells is designed with columns of dedicated local cells adjacent to each other where each DLC column is used to implement a particular logic function. In a first embodiment, local connections can be made between dedicated logic cells, e.g. an OLRC in a first DLC at level L making local point-to-point connections to an ILRC in a second DLC at level L+1. In a second embodiment, local connections can be made from any other dedicated logic cells, whether positioned horizontally or vertically relative to a relative point or multiplexer, and from any offset from a current logic and routing cell (LRC). In a third embodiment, local connections can be made by stitching a first OLRC to a second OLRC (for connecting to an ILRC), which allows lines from other columns or levels of DLC to reach an ILRC for a fast local interconnect.

12 Claims, 14 Drawing Sheets

| | ILRC | OLRC | ILRC | OLRC | ILRC | OLRC | ILRC | OLRC | |
|---|---|---|---|---|---|---|---|---|---|
| 306 LRB | 326 DLC 326-1 LRC | | 346 DLC 346-1 LRC | | 366 DLC 366-1 LRC | | 386 DLC 386-1 LRC | | 312 LRB |
| | 326-2 LRC | | 346-2 LRC | | 366-2 LRC | | 386-2 LRC | | |
| | 325 DLC 325-1 LRC | | 345 DLC 345-1 LRC | | 365 DLC 365-1 LRC | | 385 DLC 385-1 LRC | | |
| | 325-2 LRC | | 345-2 LRC | | 365-2 LRC | | 385-2 LRC | | |
| 304 LRB | 324 DLC 324-1 LRC | | 344 DLC 344-1 LRC | | 364 DLC 364-1 LRC | | 384 DLC 384-1 LRC | | 310 LRB |
| | 324-2 LRC | | 344-2 LRC | | 364-2 LRC | | 384-2 LRC | | |
| | 323 DLC 323-1 LRC | | 343 DLC 343-1 LRC | | 363 DLC 363-1 LRC | | 383 DLC 383-1 LRC | | |
| | 323-2 LRC | | 343-2 LRC | | 363-2 LRC | | 383-2 LRC | | |
| 302 LRB | 322 DLC 322-1 LRC | | 342 DLC 342-1 LRC | | 362 DLC 362-1 LRC | | 382 DLC 382-1 LRC | | 308 LRB |
| | 322-2 LRC | | 342-2 LRC | | 362-2 LRC | | 382-2 LRC | | |
| | 321 DLC 321-1 LRC | | 341 DLC 341-1 LRC | | 361 DLC 361-1 LRC | | 381 DLC 381-1 LRC | | |
| | 321-2 LRC | | 341-2 LRC | | 361-1 LRC | | 381-1 LRC | | |

320 level 0 (first column)  340 level 1 (second column)  360 level 2 (third column)  380 level 3 (fourth column)

levels of DLC 300 programmable logic chip

PROGRAMMABLE LOGIC CELLS WITH LOCAL CONNECTIONS

BACKGROUND OF THE INVENTION

1. Field of Invention

The present invention relates generally to integrated circuits (ICs) such as field programmable gate arrays (FPGAs), and more particularly to provide fast connections between dedicated logic cells in programmable logic devices.

2. Description of Related Art

Field programmable gate arrays are often selected by design engineers to provide a flexible approach in programming and re-programming integrated circuits in order to accommodate a system specification, correct errors in the system, or make improvements to the system by reprogramming the FPGA. One conventional field programmable gate array architecture is implemented using groups of look-up tables and programmable interconnect circuits. While the look-up tables and sequential elements are connected to each other, the connections to the groups of look-up tables typically originate from a switchbox located in each group of the look-up table. A hierarchical interconnect structure connects to elements in a look-up table through a switchbox, thereby serving as the primary source of connecting look-up tables from one logic block to another logic block. The inputs to the look-up tables are therefore generated primarily from the switch box. The look-up table outputs are directly fed to other look-up tables as well as the elements within the look-up tables, but the connections to other look-up tables' inputs are made through the switch box.

In another conventional structure, a majority of the inputs required for performing all functionality of configurable logic blocks are typically restricted to inputs associated with a particular configurable logic block, other than through the use of the switch box. The same is true for outputs of a particular configurable logic block which are restricted to within the configurable logic block other than through the use of the switch box.

Accordingly, it is desirable to design a programmable logic structure that provides fast interconnect by making local connections between dedicated logic cells in a programmable logic device.

SUMMARY OF THE INVENTION

The present invention describes a programmable logic structure employing input logic routing cell (ILRC) multiplexers and output logic routing cell (OLRC) multiplexers for making local connections between dedicated logic cells. In a simple programmable logic structure, a dedicated logic cell (DLC) is implemented in a programmable logic structure comprising multiple ILRC multiplexers for port A and multiple OLRC multiplexers for port B. In a multi-level programmable logic structure, multiple columns of dedicated logic cells is designed with columns of dedicated local cells adjacent to each other where each DLC column is used to implement a particular logic function. In a first embodiment, local connections can be made between dedicated logic cells, e.g. an OLRC in a first DLC at level L making local point-to-point connections to an ILRC in a second DLC at level L+1. In a second embodiment, local connections can be made from any other dedicated logic cells, whether positioned horizontally or vertically relative to a relative point or multiplexer, and from any offset from a current logic and routing cell (LRC). In a third embodiment, local connections can be made by stitching a first OLRC to a second OLRC (for connecting to an ILRC), which allows lines from other columns or levels of DLC to reach an ILRC for a fast local interconnect. In one embodiment, the term "point-to-point connection" means a connection from an output of a first LRC to an input of a second LRC.

Broadly stated, claim 1 recites a programmable logic structure for point-to-point local connections, comprises an output logic and routing cell multiplexer in a first means at a first level; and input logic and routing cell multiplexer in a second means at a second level, the output logic and routing cell multiplexer in the first means at the first level coupled to the input logic and routing multiplexer cell in the second means at the second level for point-to-point connection.

Advantageously, the present invention provides direct point-to-point connections between logic and routing cells from one dedicated logic cell to another dedicated logic cell. As a result, the present invention avoids delays that typically occur in routing connections through a switch box, multiplexers, and lines. The present invention further advantageously provides a symmetric structure in a programmable logic circuit in order to obtain local connections by placing elements, e.g. LRCs, at a location for making local connections.

Other structures and methods are disclosed in the detailed description below. This summary does not purport to define the invention. The invention is defined by the claims. These and other embodiments, features, aspects, and advantages of the invention will become better understood with regard to the following description, appended claims and accompanying drawings.

BRIEF DESCRIPTION OF THE DRAWINGS

FIG. 12A is a block diagram illustrating a programmable logic circuit that employs inverting buffers or non-inverting buffers in accordance with the present invention; FIG. 12B is a logic diagram illustrating an inverter buffer in accordance with the present invention, while

Reference symbols or names are used in the Figures to indicate certain components, aspects or features therein, with reference symbols common to more than one Figure indicating like components, aspects or features shown therein.

DETAILED DESCRIPTION OF PREFERRED EMBODIMENTS

Figure 1:
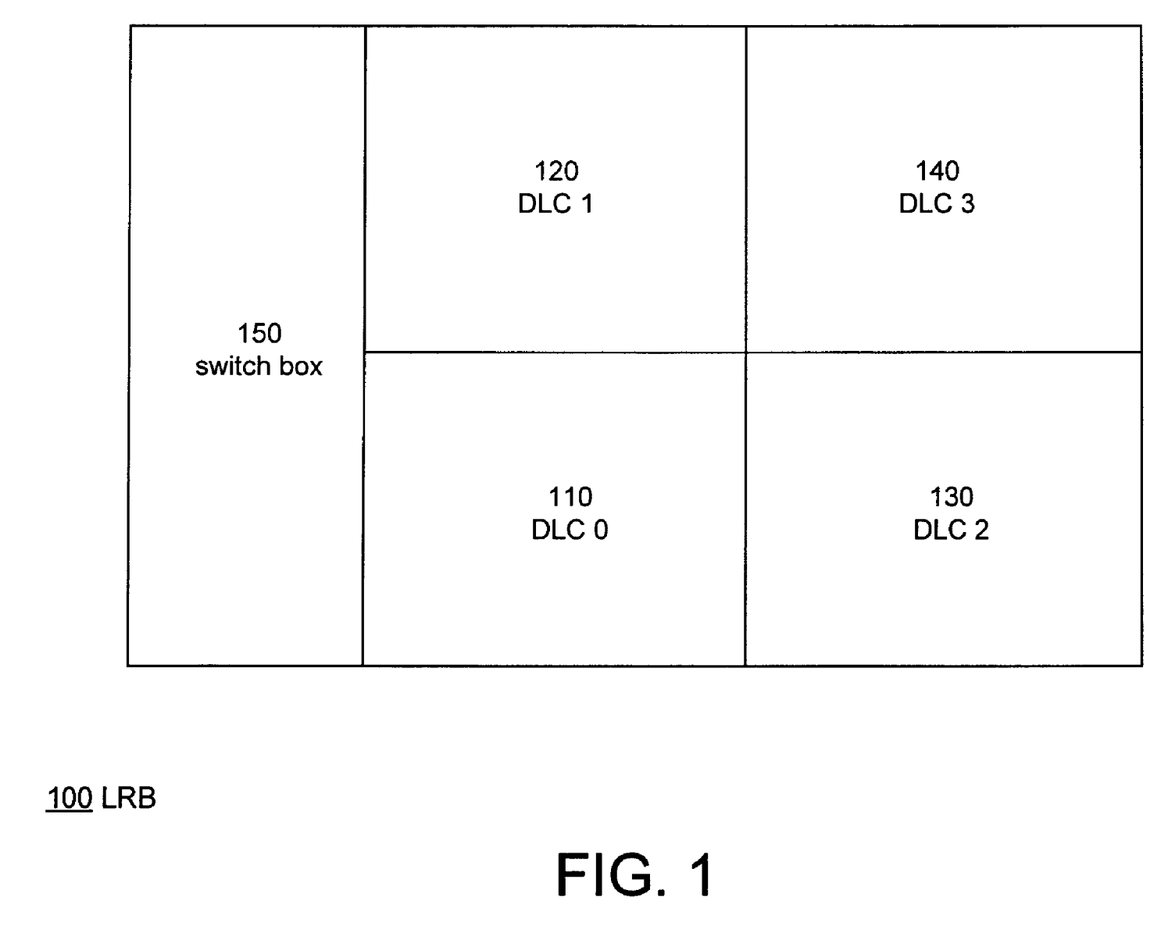
FIG. 1 is an architectural diagram illustrating a logic and routing block in a programmable logic structure with dedicated logic cells and a switch box in accordance with the present invention.

Referring now to FIG. 1, there is shown an architectural diagram illustrating a logic and routing block (LRB) 100 in a programmable logic structure comprising a first dedicated logic cell (DLC 0) 110, a second dedicated logic cell (DLC 1) 120, a third dedicated logic cell (DLC 2) 130, a fourth dedicated logic cell (DLC 3) 140 and a switch box 150 for providing programmable switch matrices. The switch box 150 provides programmable interconnects to the first dedicated logic cell 110, the second dedicated logic cell 120, the third dedicated logic cell 130, and a fourth dedicated logic cell 140. However, direct local connections, rather than connections through the switch box 150, between the first, second, third and fourth dedicated logic cells 110, 120, 130, and 140 would provide a faster connection between them.

Figure 2:
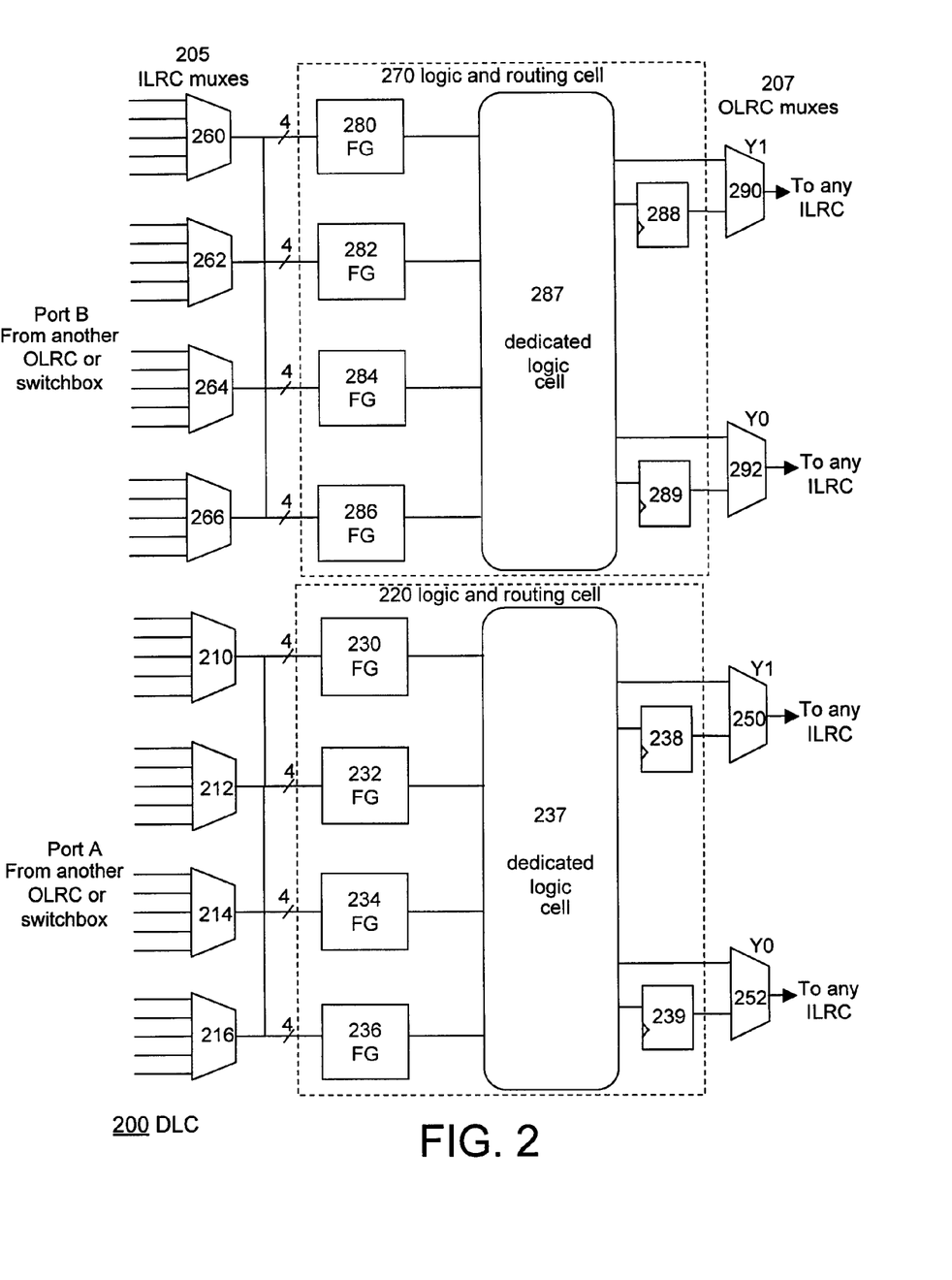
FIG. 2 is a logic diagram illustrating a dedicated logic structure in a two multiplexers scheme employing a first logic and routing cell for port A and a second logic and routing cell 270 for port B architectural diagram illustrating a logic and routing block having multiplex dedicated logic cells in accordance with the present invention.

In FIG. 2, there is shown a logic diagram illustrating a dedicated logic structure 200 in a two multiplexers scheme employing a first logic and routing cell (LRC) 220 for port A and a second logic and routing cell 270 for port B, a set of ILRC multiplexers 205 connected to inputs of the first and second LRCs 220 and 270, and a set of OLRC multiplexers 207 connected to outputs of the first and second LRCs 220 and 270. The first logic and routing cell 220 for port A comprises four look-up tables (or functional generators, FGs) 230, 232, 234, and 236, a dedicated logic cell 237, and two configurable registers 238 and 239. The first logic and routing cell 220 couples between four ILRC multiplexers 210, 212, 214, and 216, and two OLRC multiplexers 250 and 252. The first ILRC multiplexer 210 feeds into the first look-up table 230, the second ILRC multiplexer 212 feeds into the second look-up table 232, the third ILRC multiplexer 214 feeds into the third look-up table 234, and the fourth ILRC multiplexer 216 feeds into the fourth look-up table 236. The four look-up tables 230, 232, 234, and 236 are coupled to the dedicated logic cell 237. The dedicated logic cell 237 is configurable to perform selected functionalities depending on a product specification. The first OLRC multiplexer 50 selects between a first input generated from the dedicated logic cell 237 or the second input generated from the first configurable register 238 in generating an output. The second OLRC multiplexer 252 selects between a first input generated from the dedicated logic cell 237 or the second input generated from the second configurable register 239 in generating an output.

The second logic and routing cell 270 for port B comprises four look-up tables (or functional generators, FGs) 280, 282, 284, and 286, a dedicated logic cell 287, and two configurable registers 288 and 289. The second logic and routing cell 270 couples between four ILRC multiplexers 260, 262, 264, and 266, and two OLRC multiplexers 290 and 292. The first ILRC multiplexer 260 feeds into the first look-up table 280, the second ILRC multiplexer 262 feeds into the second look-up table 282, the third ILRC multiplexer 264 feeds into the third look-up table 284, and the fourth ILRC input multiplexer 266 feeds into the fourth look-up table 286. The four look-up tables 280, 282, 284, and 286 are coupled to the dedicated logic cell 287. The dedicated logic cell 287 is configurable to perform selected functionalities depending on a product specification. The first OLRC multiplexer 290 selects between a first input generated from the dedicated logic cell 287 or the second input generated from the first configurable register 288 in generating an output. The second OLRC multiplexers 292 select between a first input generated from the dedicated logic cell 287 or the second input generated from the second configurable register 289 in generating an output.

One of ordinary skill in the art should recognize that FIG. 2 is intended as one embodiment such that other variations or modifications can be practiced without departing from the spirits of the present invention, e.g. a different number of ILRC multiplexers rather than four, or a different number of OLRC multiplexers rather than two.

Figure 3:
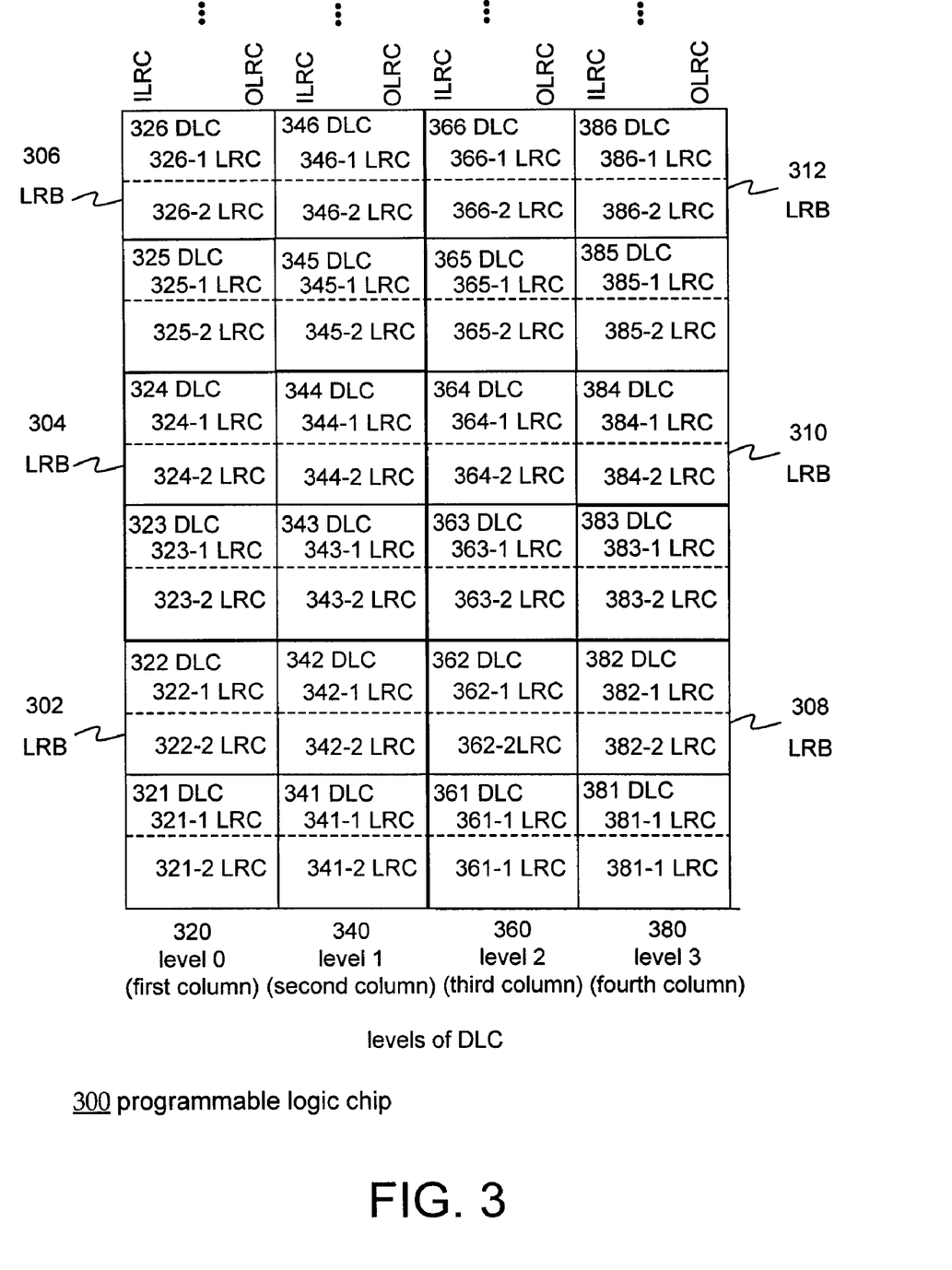
FIG. 3 is a logic diagram illustrating a programmable logic chip constructed multiple levels of dedicated logic cells in accordance with the present invention.

In FIG. 3, there is shown a logic diagram illustrating a programmable logic chip 300 constructed with multiple levels (or columns) of DLCs 320, 340, 360, and 380. One column of dedicated logic cell comprises a plurality of dedicated logic cells and connection lines to implement a logic function, such as an adder, a subtractor, an add-subtractor with add-sub control, an accumulator, registers, and multiplexers.

The programmable logic chip 300 comprises a first logic and routing block 302, a second logic and routing block 304, a third logic and routing block 306, a fourth logic and routing block 308, a fifth logic and routing block 310, and a sixth logic and routing block 312. Each of the logic and routing block comprises four dedicated logic cells arranged in a square format. The first logic and routing block 302 comprises a first dedicated logic cell 321, a second dedicated logic cell 322, a third dedicated logic cell 341, and a fourth dedicated logic cell 342. Each dedicated logic cell comprises two logic and routing cells. The first dedicated logic cell 321 has a first logic and routing cell 321-1 and a second logic and routing cell 321-2, the second dedicated logic cell 322 has a first logic and routing cell 322-1 and a second logic and routing cell 322-2, the third dedicated logic cell 341 has a first logic and routing cell 341-1 and a second logic and routing cell 341-2, and the fourth dedicated logic cell 342 has a first logic and routing cell 342-1 and a second logic and routing cell 342-2.

The second logic and routing block 304 comprises a first dedicated logic cell 323, a second dedicated logic cell 324, a third dedicated logic cell 343, and a fourth dedicated logic cell 344. The first dedicated logic cell 323 has a first logic and routing cell 323-1 and a second logic and routing cell 323-2, the second dedicated logic cell 324 has a first logic and routing cell 324-1 and a second logic and routing cell 324-2, the third dedicated logic cell 343 has a first logic and routing cell 343-1 and a second logic and routing cell 343-2, and the fourth dedicated logic cell 344 has a first logic and routing cell 344-1 and a second logic and routing cell 344-2.

The third logic and routing block 306 comprises a first dedicated logic cell 325, a second dedicated logic cell 326, a third dedicated logic cell 345, and a fourth dedicated logic cell 346. The first dedicated logic cell 325 has a first logic and routing cell 325-1 and a second logic and routing cell 325-2, the second dedicated logic cell 326 has a first logic and routing cell 326-1 and a second logic and routing cell 326-2, the third dedicated logic cell 345 has a first logic and routing cell 345-1 and a second logic and routing cell 345-2, and the fourth dedicated logic cell 346 has a first logic and routing cell 346-1 and a second logic and routing cell 346-2.

The fourth logic and routing block 308 comprises a first dedicated logic cell 361, a second dedicated logic cell 362, a third dedicated logic cell 381, and a fourth dedicated logic cell 382. The first dedicated logic cell 361 has a first logic and routing cell 361-1 and a second logic and routing cell 361-2, the second dedicated logic cell 362 has a first logic and routing cell 362-1 and a second logic and routing cell 362-2, the third dedicated logic cell 381 has a first logic and routing cell 381-1 and a second logic and routing cell 381-2, and the fourth dedicated logic cell 382 has a first logic and routing cell 382-1 and a second logic and routing cell 382-2.

The fourth logic and routing block 310 comprises a first dedicated logic cell 361, a second dedicated logic cell 362, a third dedicated logic cell 383, and a fourth dedicated logic cell 384. The first dedicated logic cell 363 has a first logic and routing cell 363-1 and a second logic and routing cell 363-2, the second dedicated logic cell 364 has a first logic and routing cell 364-1 and a second logic and routing cell 364-2, the third dedicated logic cell 383 has a first logic and routing cell 383-1 and a second logic and routing cell 383-2, and the fourth dedicated logic cell 384 has a first logic and routing cell 384-1 and a second logic and routing cell 384-2.

The sixth logic and routing block 312 comprises a first dedicated logic cell 365, a second dedicated logic cell 366, a third dedicated logic cell 385, and a fourth dedicated logic cell 386. The first dedicated logic cell 365 has a first logic and routing cell 365-1 and a second logic and routing cell 365-2, the second dedicated logic cell 366 has a first logic and routing cell 366-1 and a second logic and routing cell 366-2, the third dedicated logic cell 385 has a first logic and routing cell 385-1 and a second logic and routing cell 385-2, and the fourth dedicated logic cell 386 has a first logic and routing cell 386-1 and a second logic and routing cell 386-2.

The first column (or level 0) of logic and routing block 320 comprises the first dedicated logic cell 321, the second dedicated logic cell 322, the third dedicated logic cell 323, the fourth dedicated logic cell 324, the fifth dedicated logic cell 325, and the sixth dedicated logic cell 326. The second column (or level 1) of logic and routing block 340 is positioned adjacent to the right side of the first column of logic and routing block 320. The second column of logic and routing block 340 comprises the first dedicated logic cell 341, the second dedicated logic cell 342, the third dedicated logic cell 343, the fourth dedicated logic cell 344, the fifth dedicated logic cell 345, and the sixth dedicated logic cell 346. The third column (or level 2) of logic and routing block 360 is positioned adjacent to the right side of the second column of logic and routing block 340. The third column of logic and routing block 360 comprises the first dedicated logic cell 361, the second dedicated logic cell 362, the third dedicated logic cell 363, the fourth dedicated logic cell 364, the fifth dedicated logic cell 365, and the sixth dedicated logic cell 366. The fourth column (or level 3) of logic and routing block 380 is positioned adjacent to the right side of the third column of logic and routing block 360. The fourth column of logic and routing block 380 comprises the first dedicated logic cell 381, the second dedicated logic cell 382, a third dedicated logic cell 383, the fourth dedicated logic cell 384, the fifth dedicated logic cell 385, and the sixth dedicated logic cell 386.

Figure 4:
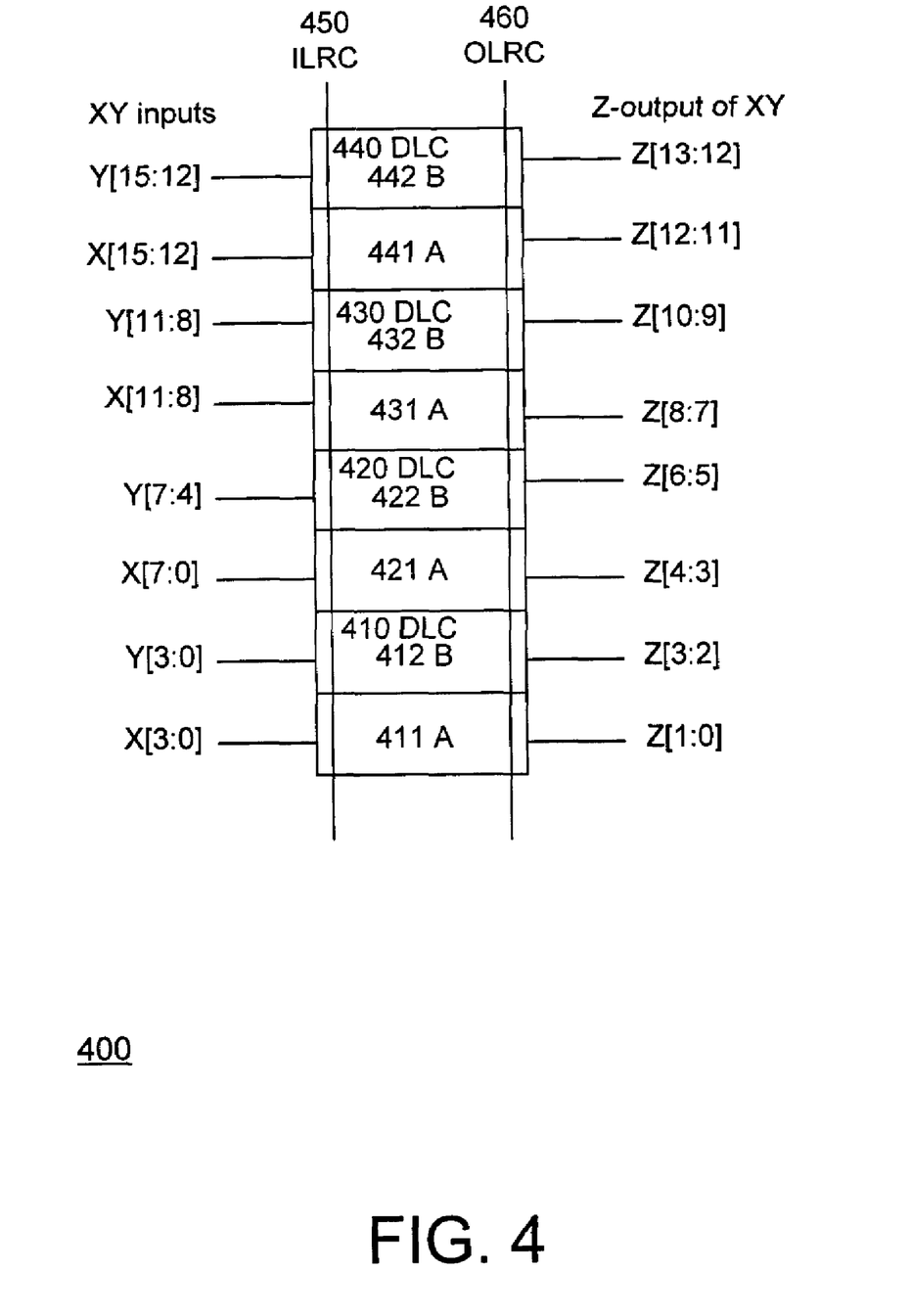
FIG. 4 is a block diagram illustrating an example in performing a logic operation in a single column of dedicated logic cells in accordance with the present invention.

In FIG. 4, there is shown a block diagram illustrating an example in performing a logic operation in a single column of dedicated logic cells 400. The single column of dedicated logic cells 400 comprises a first dedicated logic cell 410 having a first LRC 411 and a second LRC 412, a second dedicated logic cell 420 having a first LRC 421 and a second LRC 422, a third dedicated logic cell 430 having a first LRC 431 and a second LRC 432, and a fourth dedicated logic cell 440 having a first LRC 441 and a second LRC 442. A first set of inputs, X[3:0], X[7:4], X[11:8], and X[15:12] are fed into ports A in the first dedicated logic cell 410, a second dedicated logic cell 420, a third dedicated logic cell 430, and a fourth dedicated logic cell 440, respectively. A second set of inputs, Y[3:0], Y[7:4], Y[11:8], and Y[15:12] are fed into ports B in the first dedicated logic cell 410, a second dedicated logic cell 420, a third dedicated logic cell 430, and a fourth dedicated logic cell 440, respectively. The single column of dedicated logic cells 400 performs a logic operation for the A and B inputs, represented as A (dlcop) B, where the symbol "dlcop" denotes a DLC operation. Examples of the DLC operation include addition (A+B), subtraction (A−B), multiplication (A*B), division (A/B), NOR A, NOR B, or other type of logic operations. The single column of dedicated logic cells 400 couples to a set of ILRC multiplexers 450 at the inputs and couples to a set of OLRC multiplexers 460 at the outputs.

Figure 5:
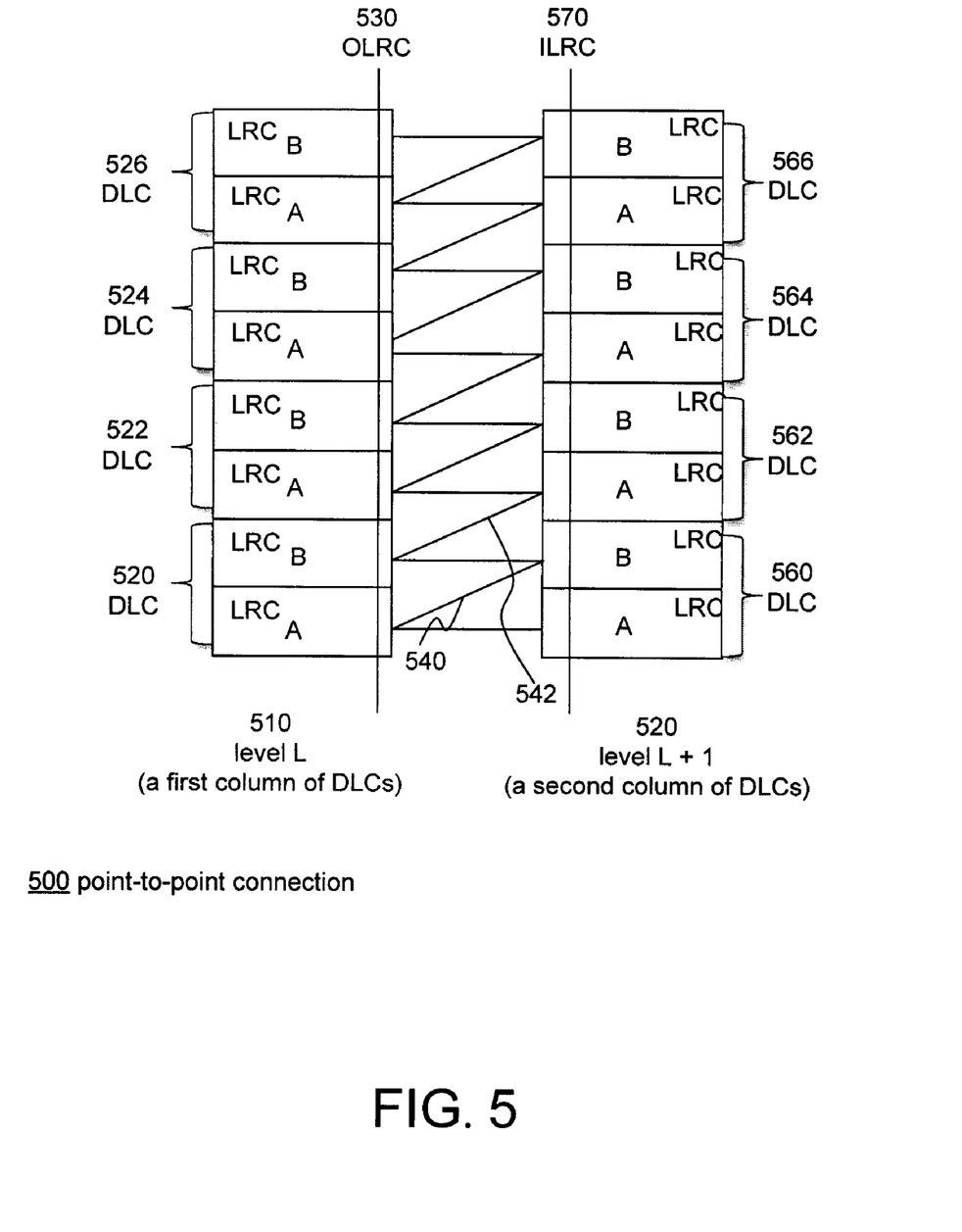
FIG. 5 is a logic diagram illustrating a first example of a programmable logic circuit 500 employing local connections between different levels of dedicated logic cells in accordance with the present invention.

In FIG. 5, there is shown a logic diagram illustrating a first example of a programmable logic circuit 500 employing local connections between different levels of DLCs. In this example, the programmable logic circuit 500 has local connections from a level L 510 to a level L+1 520 connection. The level L 510 represents a first column of DLCs 520, 522, 524, and 526, where each DLC contains two LRCs. The level L 550 represents a second column of DLCs 560, 562, 564, and 566, where each DLC contains two LRCs. The level L 510 has a set of OLRCs 530 connected to a set of ILRC 570 in the level L+1.

Figure 6:
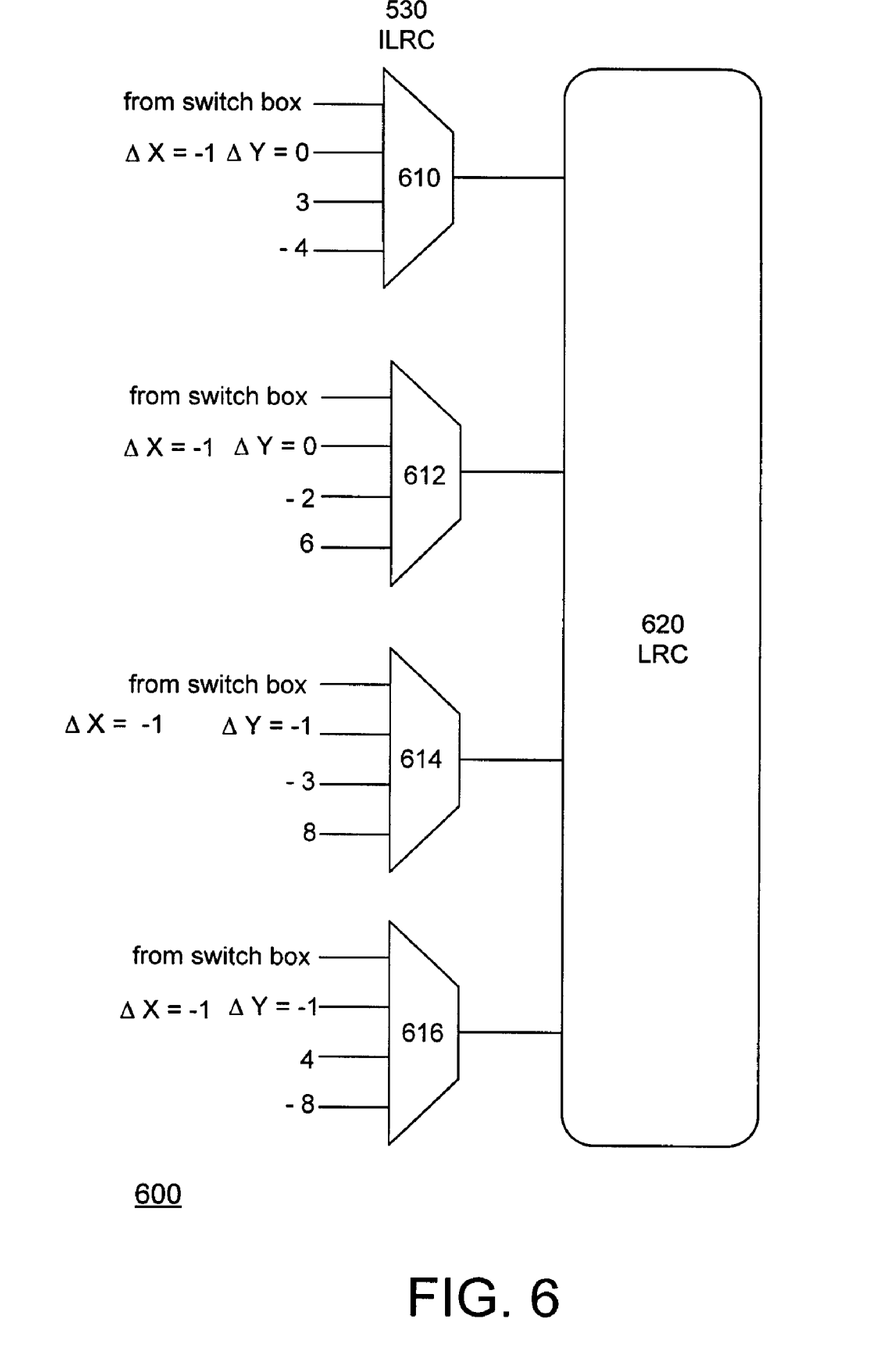
FIG. 6 is a logic diagram illustrating a programmable logic circuit with a set of offset parameters for feeding the OLRC multiplexer in the level L to the ILRC multiplexer in the level L+1 in accordance with the present invention.

The programmable logic circuit 500 has a set of offset parameters as show in FIG. 6 for feeding the OLRC multiplexer 530 in the level L 510 into the ILRC multiplexer 570 in the level L+1 520. The ILRC 570 in the level L+1 520 comprises a first ILRC multiplexer 610, a second ILRC multiplexer 612, a third ILRC multiplexer 614, and a fourth ILRC multiplexer 616, where all four of the ILRC multiplexers 610, 612, 614, and 616 are coupled to a logic and routing cell 620. The first ILRC multiplexer 610 has an offset of $(\Delta X, \Delta Y)=(-1, 0)$, the second ILRC multiplexer 612 has an offset of $(\Delta X, \Delta Y)=(-1, 1)$, the third ILRC multiplexer 614 has an offset of $(\Delta X, \Delta Y)=(-1, -1)$, and the fourth ILRC multiplexer 616 has an offset of $(\Delta X, \Delta Y)=(-1, 1)$. The configuration of the local connections for the first, second, third, and fourth ILRC multiplexers 610, 612, 614, and 616 are shown in FIG. 5, e.g. a diagonal connection line 540 connects between a port A in level L 510 to a port B in level L+1 520, and a diagonal connection line 542 connects between a port B 510 in level L to a port A in level L+1 520.

Figure 7:
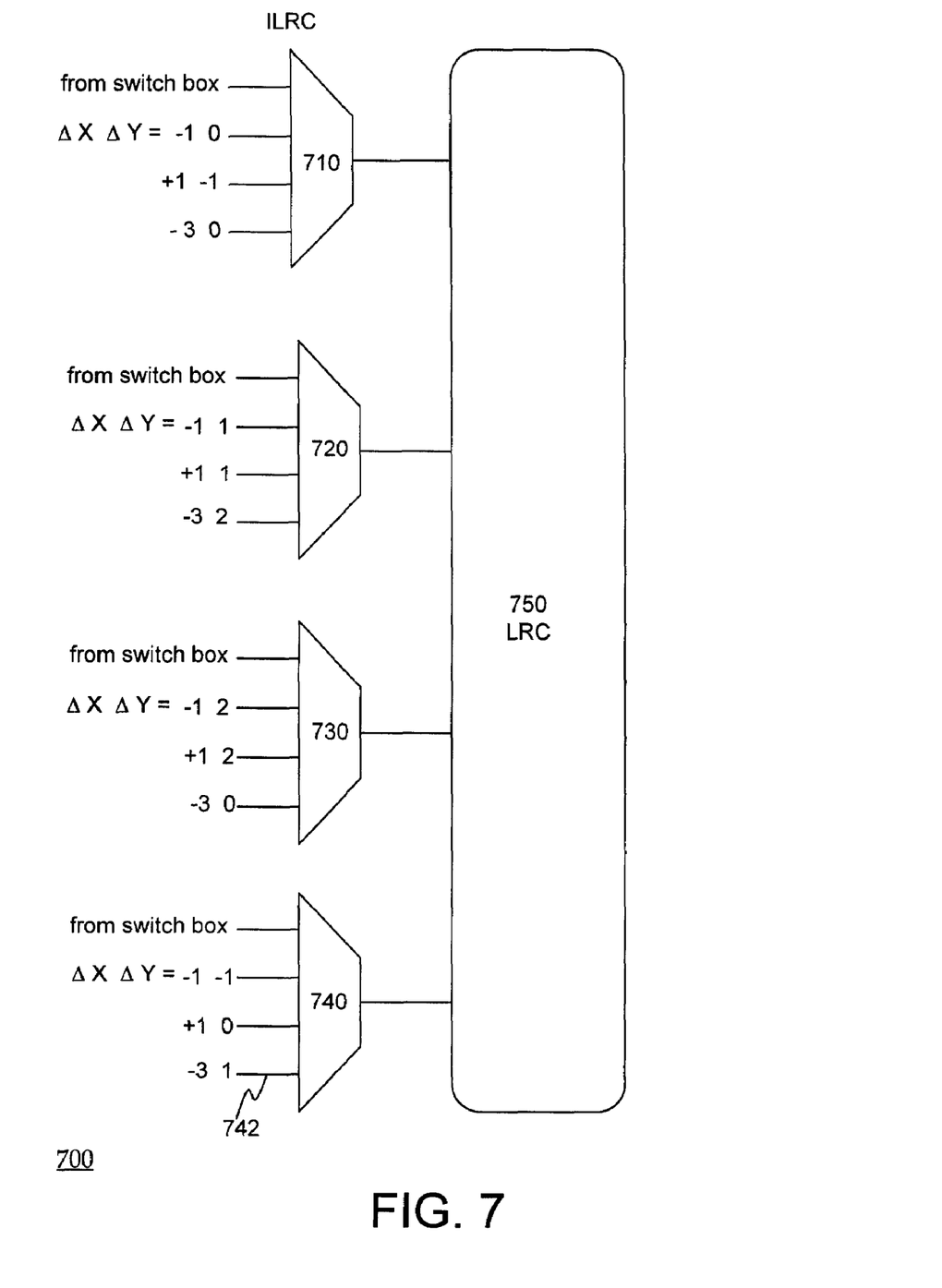
FIG. 7 is a logic diagram illustrating a second example of a programmable logic circuit employing local connections between different levels of dedicated logic cells in accordance with the present invention.

Referring now to FIG. 7, there is shown a logic diagram illustrating a second example of a programmable logic circuit 700 employing local connections between different levels of DLCs. The programmable logic circuit 700 comprises a first input logic and routing cell multiplexer 710, a second input logic and routing cell multiplexer 720, a third input logic and routing cell multiplexer 730, and a fourth input logic and routing cell multiplexer 740, where all four of the input and logic and routing cell multiplexers 710, 720, 730, and 740 are coupled to logic and routing cell 750. The first ILRC multiplexer 710 has an offset of (ΔX, ΔY)=(-1, 0), the second ILRC multiplexer 720 has an offset of (ΔX, ΔY)=(-1, 1), the third ILRC multiplexer 730 has an offset of (ΔX, ΔY)=(-1, -1), and the fourth ILRC multiplexer 740 has an offset of (ΔX, ΔY)=(-1, 2). One of skill in the art should recognize that the programmable logic circuit 700 illustrates that local connections can be made from any level of DLCs or any offset from the current LRC. For example, the input logic and routing cell multiplexer 740 has a fourth input that is generated from an offset of (-3, 1) 742 that represents a feedback connection.

Figure 8:
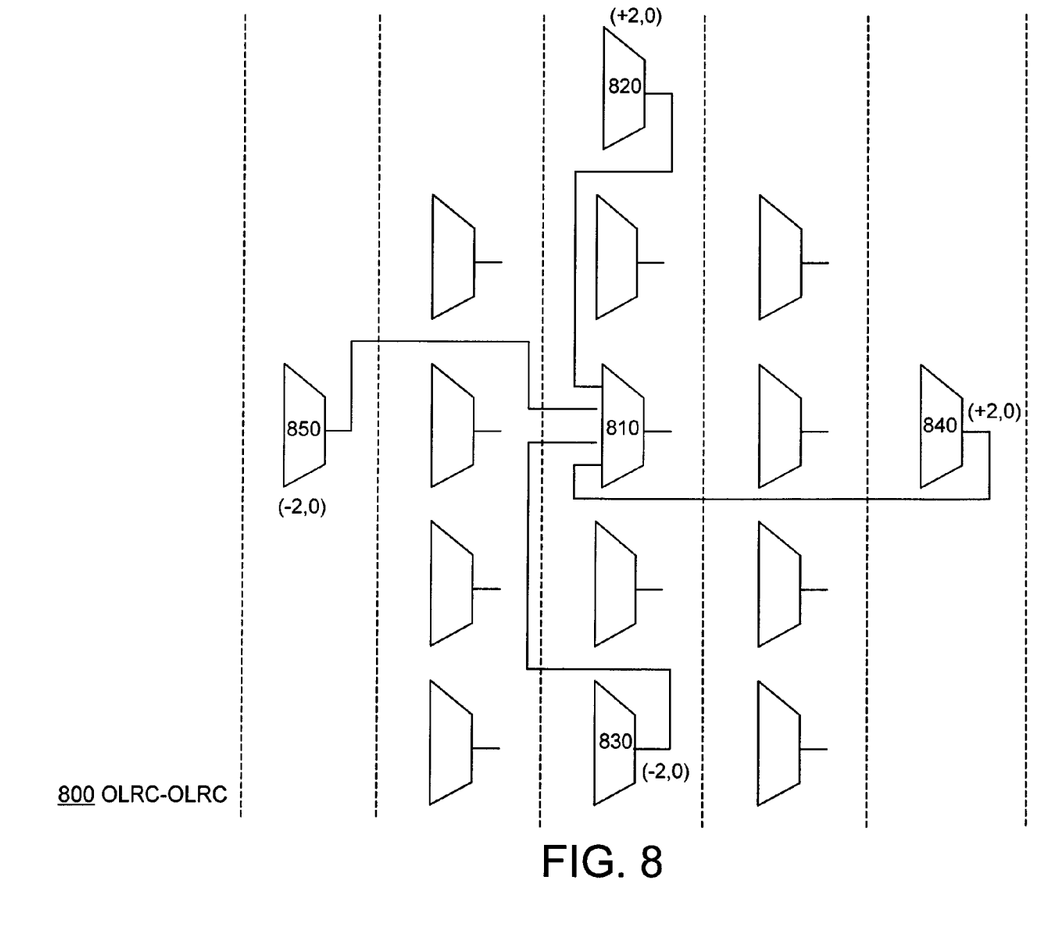
FIG. 8 is an architectural diagram illustrating a programmable logic circuit with stitchings between output OLRC multiplexers in accordance with the present invention.

Referring now to FIG. 8, there is shown an architectural diagram illustrating a programmable logic circuit 800 with stitchings between output logic and routing cells. When a first OLRC does not have a connection an ILRC, the first OLRC may be able to stitch to a second OLRC for making a local connection to the ILRC. The programmable logic circuit 800 has a first OLRC 810 with stitchings from the top, the bottom, the left, and the right side relative to the first OLRC 810. The first OLRC 810 has a first input connected to a second OLRC 820, a second input connected to a third OLRC 830, a third input connected to a fourth OLRC 840, and a fourth input connected to a fifth OLRC 850. When the first OLRC 810 serves as reference point, the relative positions of the other OLRCs are as follows: the second OLRC 820 has an offset of (+2, 0) that stitches to the first OLRC 810, the third OLRC 830 has an offset of (-2, 0) that stitches to the first OLRC 810, the fourth OLRC 840 has an offset of (+2, 0) that stitches to the first OLRC 810, and the fifth OLRC 850 has an offset of (-2, 0) that stitches to the first OLRC 810. The configuration in the programmable logic circuit 800 allows lines from other levels to connect from one OLRC to a ILRC through another OLRC. The local connections can be made from any levels including horizontal levels and vertical levels.

Figure 9:
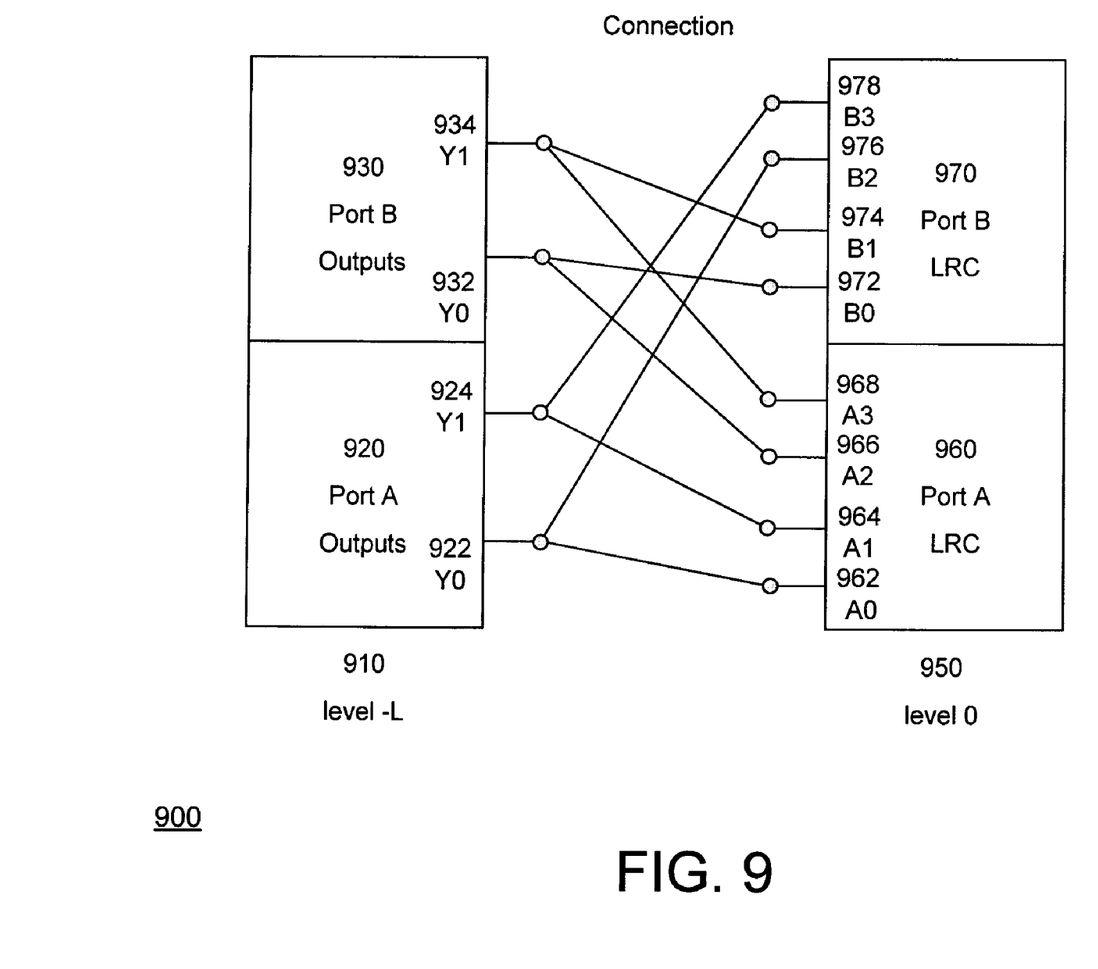
FIG. 9 is a block diagram illustrating a programmable logic circuit with two dedicated logic cells from the OLRC at level −L to the ILRC at the ate level 0 in accordance with the present invention.

In FIG. 9, there is shown a block diagram illustrating a programmable logic circuit 900 with two DLCs so that outputs (OLRC) from a first DLC 910 at level -L makes local connections to inputs (ILRC) in a second DLC 920 at level 0. The first DLC 910 in the level -L 910 comprises a port A 920 and a port B 930 where the port A 920 has Y0 922 and Y1 924 outputs, and the port B 930 has Y0 932 and Y1 934 outputs. The second DLC 950 in the level 0 950 comprises the port A 960 and the port B 970 where the port A 960 has an input A0 962, an input A1 964, an input A2 966, and an input A3 968, while the port B 970 has an input B0 972, an input B1 974, an input B2 976, and an input B3 978. The local connections between the first DLC 910 and the second DLC 920 are made as follows: A0-Y0 (-L, 0), A1-Y1 (-L, 0), A2-Y0 (-L, 1), A3-Y1 (-L, 1), B0-Y0 (-L, 0), B1-Y1 (-L, 0), B2-Y0 (-L, -1), and B3-Y1 (-L, -1).

Figure 10:
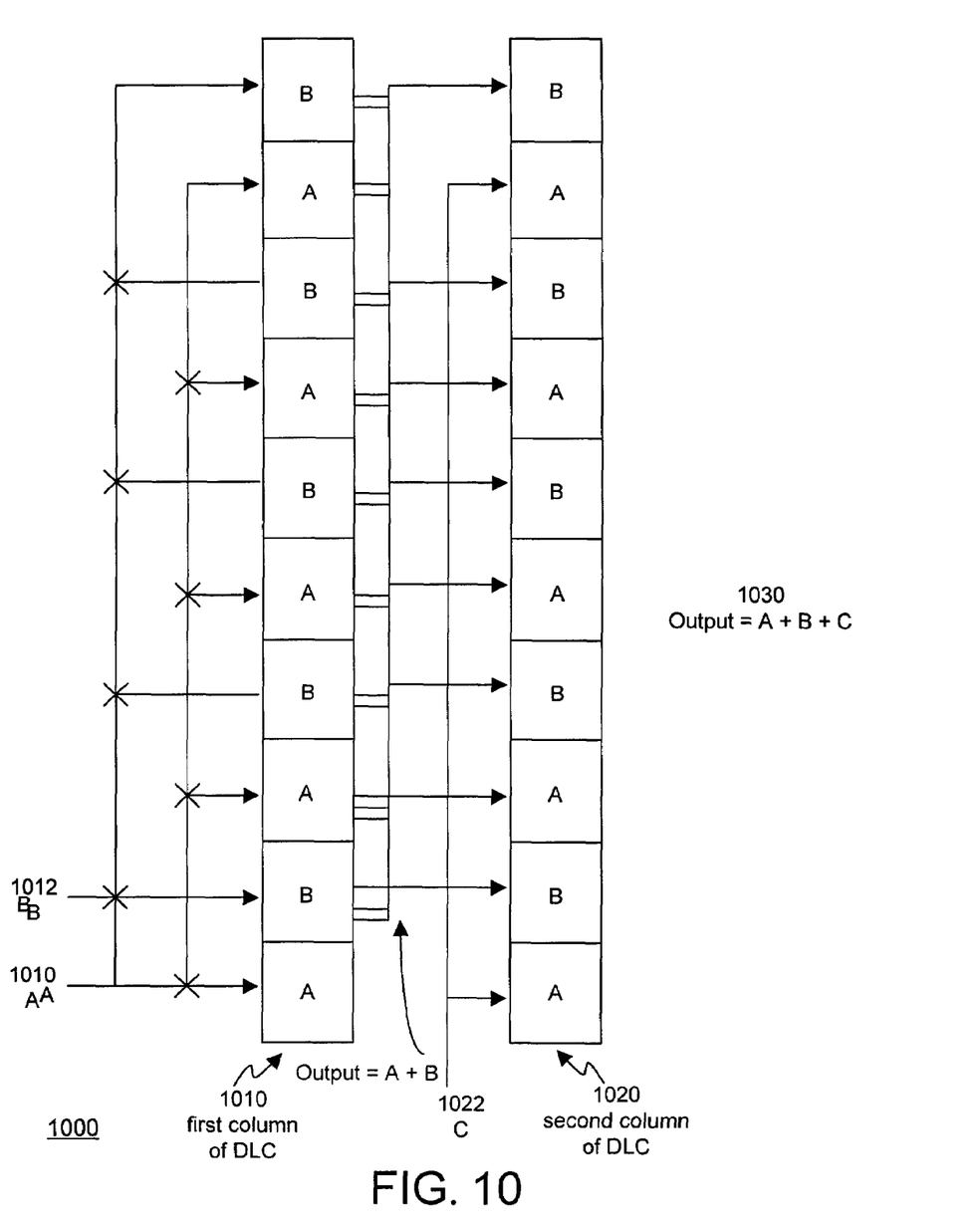
FIG. 10 is a block diagram illustrating a programmable logic circuit with local connections for performing a logic operation of A+B+C in accordance with the present invention.

FIG. 10 is a block diagram illustrating a programmable logic circuit 1000 with local connections for performing a logic operation of A+B+C. The programmable logic circuit 1000 comprises a first column of DLC 1010 and a second column of DLC 1020. The first column of DLC 1000 receives a first input A 1012 and a second input B 1014 to perform a logic operation of A+B. The second column of DLC 1020 receives an input C 1022 and outputs from the first column of DLC 1010 to perform the logic operation of A+B+C to generate an output 130 of A+B+C. One of skill in the art should recognize that the columns of DLCs can be altered to perform other type of logical operations, such as add, subtract, and multiply. The number of inputs can be represented generally by the symbol n, where n can be either 1, 2, 3, 4, other any other integer number to suit a particular product design.

Figure 11:
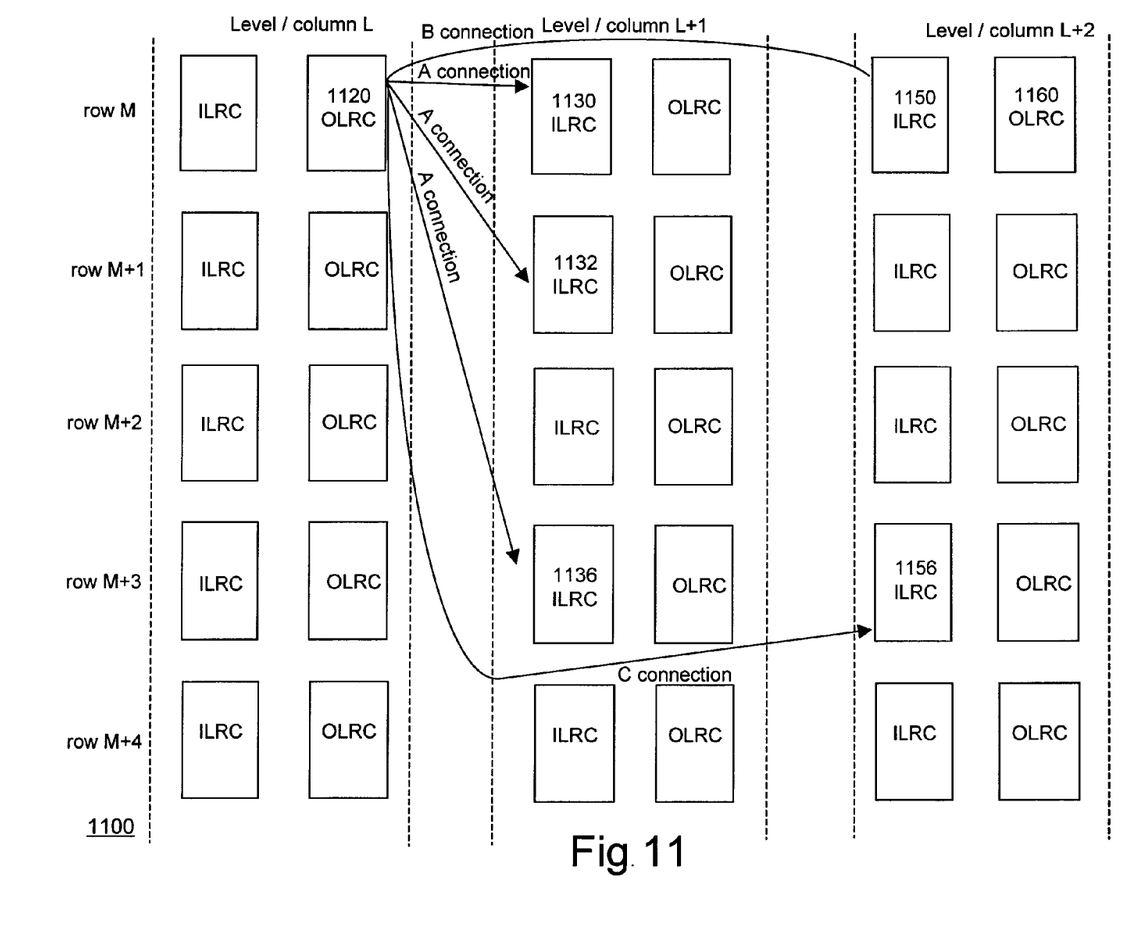
FIG. 11 is a block diagram illustrating a programmable logic circuit with local connections for fan out, a horizontal offset for a local connection from one column to another column, and a vertical offset for a local connection from one row to another row in accordance with the present invention.

Turning now to FIG. 11, there is shown a block diagram illustrating a programmable logic circuit 1100 with local connections for fan out, a horizontal offset for a local connection from one column to another column, and a vertical offset for a local connection from one row to another row. The programmable logic circuit 1100 comprises a plurality of horizontal columns: a level or column L, a column L+1, a column L+2, and a plurality of vertical rows: a row M, a row M+1, a row M+2, a row M+3, and a row M+4. There are three types of local connections that are shown in this embodiment where an OLRC 1120 serves as a reference point. First, designated as A connection that shows fan out local connections, the OLRC 1120 in the column L makes point-to-point local connections from the OLRC 1120 in the row M/the column L to several ILRCs in the row M/column L+1, i.e. an ILRC 1130, an ILRC 1132, and an ILRC 1136 in the column L+1. Second, designed as B connection that shows a horizontal offset, the OLRC 1120 makes a point-to-point local connection from the OLRC 1120 in the row M/the column L to an ILRC 1150 in the column L+2. Third, designated as C connection that shows a vertical offset, the OLRC 1120 makes a point-to-point local connection to an ILRC 1156 in the row M+3/the column L+2.

Figure 12:
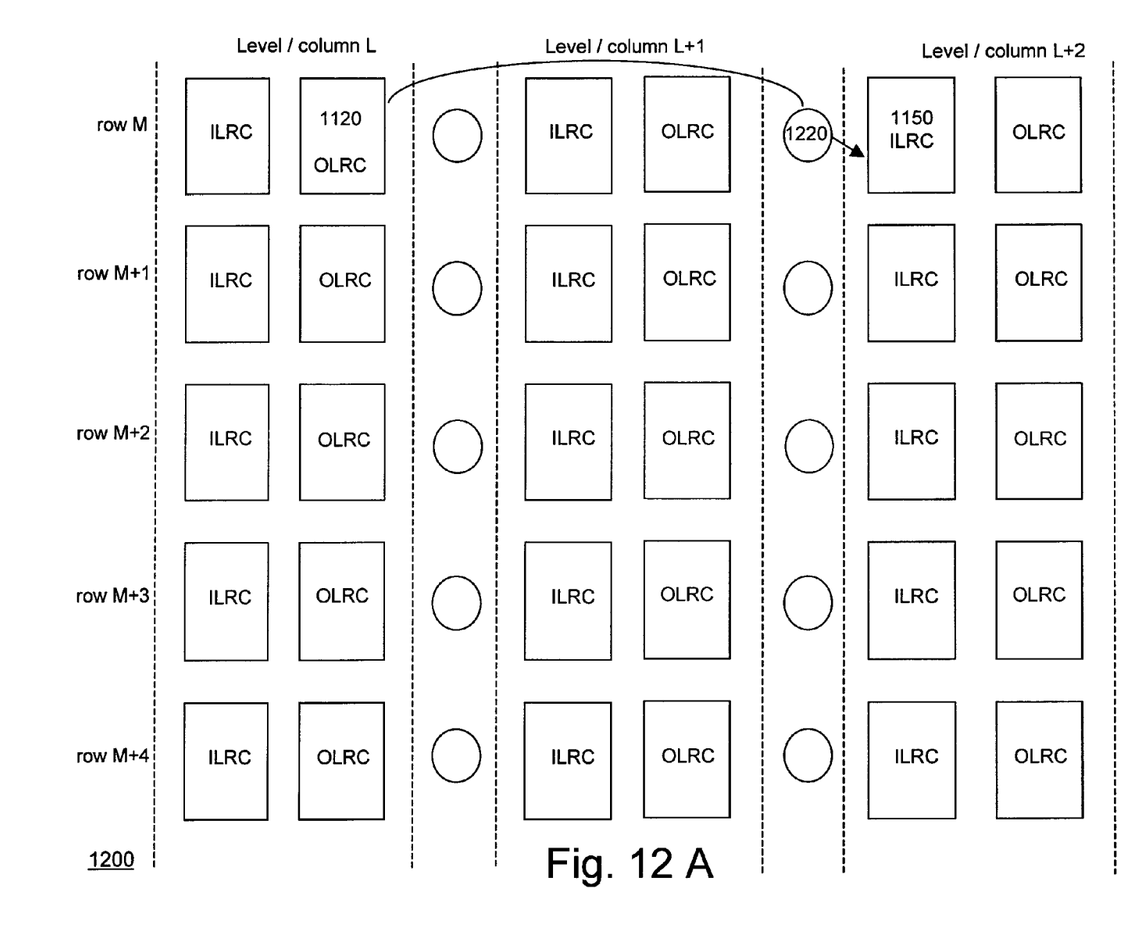
Figure 12B:
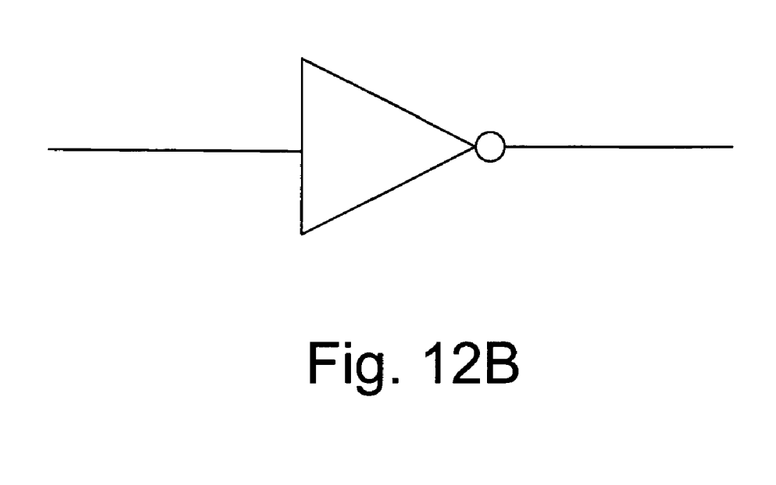
Figure 12C:
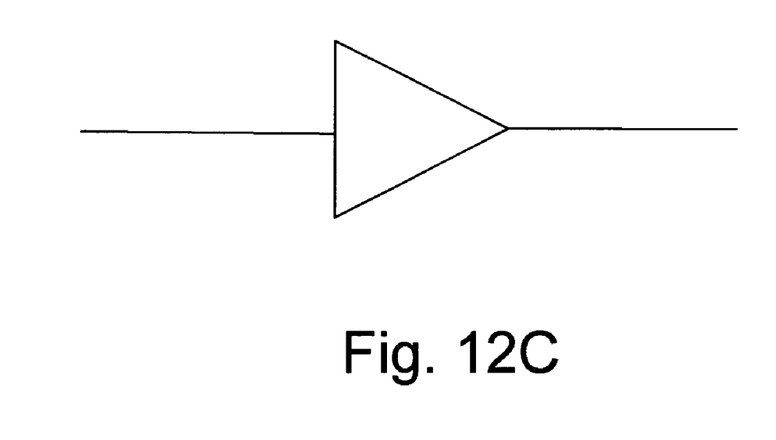
FIG. 12C is a logic diagram illustrating a non-inverter buffer in accordance with the present invention.

In FIG. 12A, there is shown a block diagram illustrating a programmable logic circuit 1200 that employs inverting buffers or non-inverting buffers. An inverter buffer is represented by an inverter, as shown in FIG. 12B, while a non-inverting buffer is represented by an inverter but without the inverting node, as shown in FIG. 12C. The OLRC 1120 is again used as a reference point. The OLCR 1120 makes a local connection to an ILRC 1150 through a buffer 1220, which can be either an inverting buffer or a non-inverting buffer. One of ordinary skill in the art should recognize that other variations of buffering a local connection can be practiced without departing from the spirits of the present invention.

Figure 13:
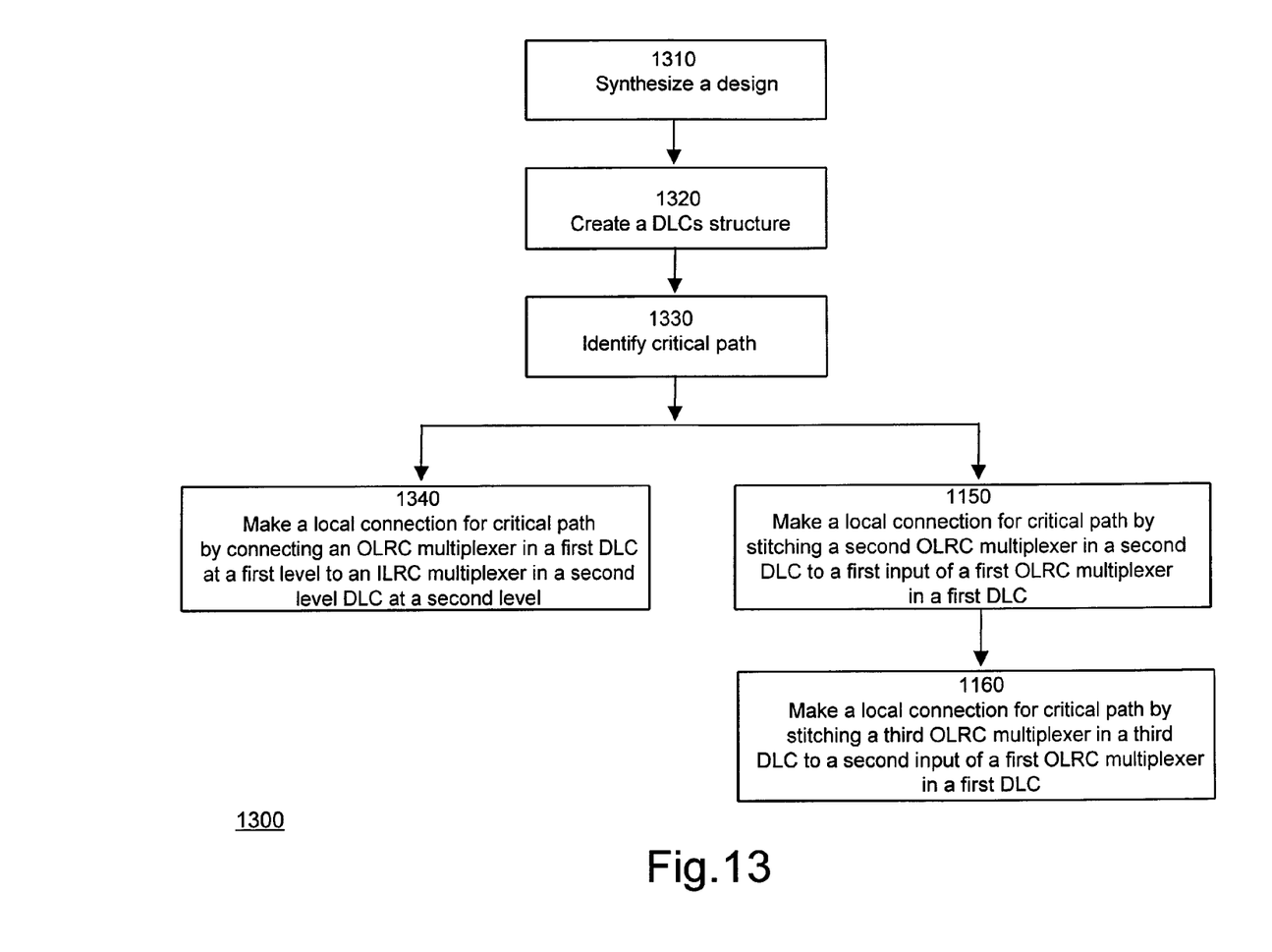
FIG. 13 is a flow diagram illustrating the process for programming a programmable logic circuit with local connections between dedicated logic cells in accordance with the present invention.

FIG. 13 is a flow diagram illustrating the process 1300 for programming a programmable logic circuit with local connections between dedicated logic cells. At step 1310, the process 1300 synthesizes or reads a particular product design. The process 1300 creates a dedicated logic cells structure suitable for the selected product design at step 1320. At step 1330, the process 1300 identifies the critical path of the dedicated logic cells structure. Local connections between the dedicated logic cells can be made using various methods. In one method at step 1340, local connections are made between the dedicated logic cells for the critical path by connecting an OLRC multiplexer in a first dedicated logic cell at a first level to an ILRC multiplexer in a second dedicated logic cell at a second level. In another method at step 1350, where there are no direct connection from one OLRC to an ILRC, local connections are made between dedicated logic cells for critical path by stitching a second OLRC multiplexer feeding into a first input of a first OLRC multiplexer. The first OLRC multiplexer and the second OLRC multiplexer can reside in the same level of DLC or from another level of DLC. Additional stitching can be made from other OLRC multiplexers feeding into inputs of the first OLRC multiplexers in a first DLC as described at step 1360.

Those skilled in the art can now appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications, whether explicitly provided for by the specification or implied by the specification, will become apparent to the skilled practitioner upon a study of the drawings, specification, and following claims.

We claim:

1. A programmable logic structure for point-to-point local connections, comprising
an output logic and routing cell multiplexer in a first means at a first level; and
a first input logic and routing cell multiplexer in a second dedicated logic at a second level, the output logic and routing cell multiplexer in the first dedicated logic cell at the first level making a direct point-to-point connection to the first input logic and routing multiplexer cell in the second dedicated logic cell at the second level without routing the connection through a switch circuit;
wherein the first dedicated logic cell comprises;
a first logic and routing cell; and
a second logic and routing cell coupled to the first logic and routing cell, the first logic and routing cells including:
a first look-up table having a plurality of inputs for receiving a set of inputs and at least one output;
a second look-up table having a plurality of inputs for receiving the set of inputs and at least one output;
a third look-up table for receiving at least one input and generating at least one output; and
a fourth-look-up table for receiving at least one input and generating at least one output;
a logic having inputs coupled to the first, second, third, fourth look-up tables and generating at least one output.

2. The programmable logic structure of claim 1, wherein the first level to the second level point-to-point connection comprises L to L+1 point-to-point connection; and wherein the first dedicated logic cell at the first level is symmetric to the second dedicated logic cell at the second level.

3. The programmable logic structure of claim 1, wherein the first level to the second level point-to-point connection comprises L to L−n, where n is a positive integer number; and wherein the first dedicated logic cell at the first level is symmetric to the second dedicated logic cell at the second level.

4. The programmable logic structure of claim 1, wherein the first level to the second level point-to-point connection comprises L to L+n that denotes a horizontal offset, where n is a positive integer number; and wherein the first dedicated logic cell at the first level is symmetric to the second dedicated logic cell at the second level.

5. The programmable logic structure of claim 1, wherein the first level to the second level point-to-point connection comprises M to M+n that denotes a vertical offset, where n is a positive integer number; and wherein the first dedicated logic cell at the first level is symmetric to the second dedicated logic cell at the second level.

6. The programmable logic structure of claim 1, wherein the programmable logic structure produces fan out point-to-point connections by coupling the output logic and routing cell multiplexer commonly to the first input logic and routing cell multiplexer and a second input logic and routing cell multiplexer.

7. The programmable logic structure of claim 1, further comprises a buffer that couples between the output logic and routing cell multiplexer in the first dedicated logic cell at the first level and the first input logic and routing cell multiplexer in the second dedicated logic cell in the second level, the buffer comprising an inverter buffer or a non-inverting buffer.

8. The programmable logic structure of claim 1, wherein the first dedicated logic cell resides in a logic and routing block, the logic and routing block including one or more dedicated logic cells.

9. A method for programming a programmable logic circuit, comprising:
providing a first dedicated logic cell and a second dedicated logic cell, the first dedicated logic cell having a first output logic and routing cell multiplexer with an input, the second dedicated logic cell having a second output logic and routing cell multiplexer with an output; and
stitching the output of the second output logic and routing cell multiplexer in the second dedicated logic cell to the input of the first output logic and routing cell multiplexer in the first dedicated logic cell by making a direct point-to-point connection between the output of the second output logic and routing cell and the input of the first output logic and routing cell without routing the connection through a switch circuit;
wherein the first dedicated logic cell comprises:
a first logic and routing cell and
a second logic and routing cell coupled to the first logic and routing cell, the first logic and routing cells including:
a first look-up table having a plurality of inputs for receiving a set of inputs and at least one output;
a second look-up table having a plurality of inputs for receiving the set of inputs and at least one output;
a third look-up table for receiving at least one input and generating at least one output; and
a fourth-look-up table for receiving at least one input and generating at least one output;
a logic having inputs coupled to the first, second, third, fourth look-up tables and generating at least one output.

10. The method of claim 9, further comprising stitching a third OLRC multiplexer to a second input of the first OLRC multiplexer through a local connection.

11. The method of claim 10, wherein the first OLRC multiplexer and the second OLRC multiplexer reside in the same level of dedicated logic cells.

12. The method of claim 10, wherein the first OLRC multiplexer resides in a different level of dedicated logic cells than the second OLRC multiplexer.

* * * * *